United States Patent
Tai et al.

(10) Patent No.: US 10,747,614 B2
(45) Date of Patent: Aug. 18, 2020

(54) HYBRID ITERATIVE ERROR CORRECTING AND REDUNDANCY DECODING OPERATIONS FOR MEMORY SUB-SYSTEMS

(71) Applicant: Micron Technology, Inc., Boise, ID (US)

(72) Inventors: Ying Yu Tai, Mountain View, CA (US); Jiangli Zhu, San Jose, CA (US); Zhengang Chen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/042,812

(22) Filed: Jul. 23, 2018

(65) Prior Publication Data
US 2020/0026602 A1    Jan. 23, 2020

(51) Int. Cl.
*H03M 13/00* (2006.01)
*G06F 11/10* (2006.01)
*H03M 13/29* (2006.01)
*H03M 13/37* (2006.01)

(52) U.S. Cl.
CPC ..... *G06F 11/1076* (2013.01); *H03M 13/2906* (2013.01); *H03M 13/3746* (2013.01)

(58) Field of Classification Search
CPC ........... G06F 11/1076; H03M 13/2906; H03M 13/3746
See application file for complete search history.

(56) References Cited

U.S. PATENT DOCUMENTS

| 9,009,565 | B1 * | 4/2015 | Northcott | G11C 29/42 365/185.09 |
|---|---|---|---|---|
| 2015/0162099 | A1 | 6/2015 | Jeong et al. | |
| 2017/0262332 | A1 | 9/2017 | Barndt et al. | |
| 2017/0357467 | A1 | 12/2017 | McGlaughlin et al. | |
| 2019/0026181 | A1 * | 1/2019 | Kim | G06F 11/1068 |

FOREIGN PATENT DOCUMENTS

| KR | 10-2018-0003320 | 1/2018 |
|---|---|---|
| KR | 10-2018-0079495 | 7/2018 |

OTHER PUBLICATIONS

PCT International Search Report and Written Opinion for International Application No. PCT/US2019/043091 dated Nov. 13, 2019, 11 pages.

* cited by examiner

*Primary Examiner* — Samir W Rizk
(74) *Attorney, Agent, or Firm* — Lowenstein Sandler LLP

(57) ABSTRACT

Data stored on each of a set of memory components can be read. Corresponding data stored on a number of the set of memory components that cannot be decoded using an error correction code decoding operation can be identified. A determination can be made whether the number of the set of memory components that include the corresponding data that cannot be decoded from the ECC decoding operation satisfies a threshold condition. Responsive to determining that the number of the set of memory components that include the corresponding data that cannot be decoded from the second ECC decoding operation satisfies the threshold condition, a processing device, can perform a redundancy error correction decoding operation to correct the data stored on each of the set of memory components.

17 Claims, 6 Drawing Sheets

HYBRID ITERATIVE ERROR CORRECTING AND REDUNDANCY DECODING OPERATIONS FOR MEMORY SUB-SYSTEMS

TECHNICAL FIELD

The present disclosure generally relates to a memory sub-system, and more specifically, relates to allocating variable media types of memory components in a memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
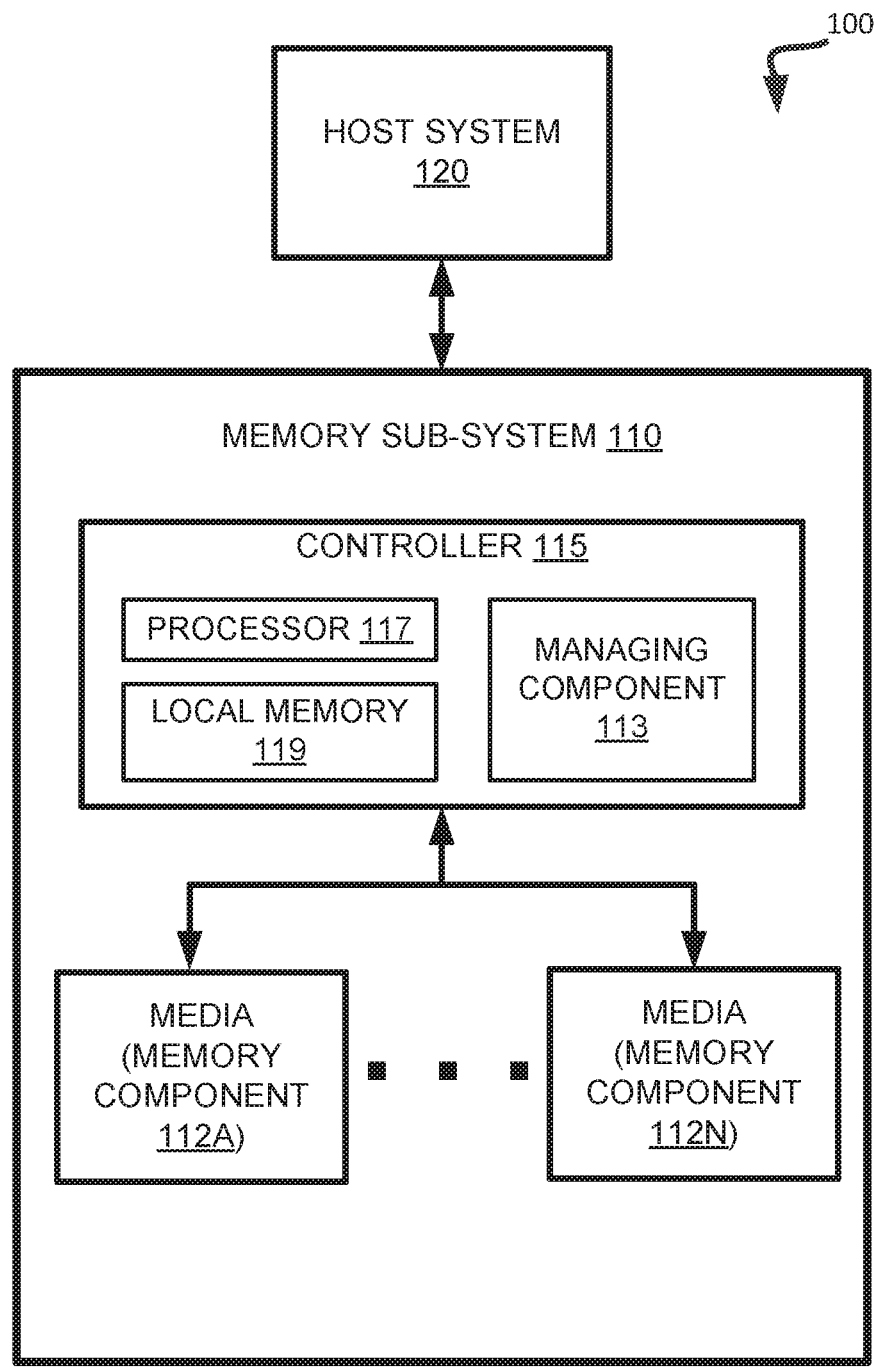
FIG. 1 illustrates an example computing environment that includes a memory sub-system in accordance with some embodiments of the present disclosure.

Aspects of the present disclosure are directed to providing a memory sub-system including hybrid iterative error correcting code decoding operations and redundancy error correction decoding operations for data in the memory sub-system. A memory sub-system is also hereinafter referred to as a "memory device". An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Conventionally, there are several techniques used to attempt to improve the performance and/or reduce any errors included in data of a memory sub-system. One technique, referred to as Redundant Array of Independent Disks (RAID) or Redundant Array of Independent NAND (RAIN), can be used to improve the reliability and/or performance of data storage. A RAID system can include two or more memory components operating in parallel. The RAID system can employ mirroring of data, striping of data, or some combination thereof depending on which level (e.g., 0, 1, 5, 6, 10, etc.) of RAID is being used. Mirroring refers to storing data at least twice, once on a first memory component, and again on a second memory component of the memory sub-system. When one of the memory components fails, the data on the other memory component can be used for data recovery and operation of the memory sub-system can continue.

Striping refers to splitting data into data blocks that are written across each memory component in the array. Using numerous memory components at the same time can improve the performance of the memory sub-system by allowing reads and/or writes to occur concurrently. Additionally, in some conventional systems, parity data (e.g., checksum) can be calculated from the data blocks striped across the memory components and the parity data can be stored on its own individual memory component as part of the stripe with the other data blocks. The memory sub-system can use the parity data to reconstruct the data of one of the other memory components if that data includes an error. For example, when the data of one of the memory components includes an error, a redundancy operation (e.g., logical operation) can be performed on the error-free data of the other memory components to reconstruct the data with the error. Generally, redundancy operations can guarantee that the errors in the data are removed by reconstructing the data for the memory component including the data with the error.

This particular technique can be limited to removing the errors for the data of one memory component in a RAID level 5 (referred to herein as "RAID 5") configuration because the parity data is written to one memory component and removing the errors for the data of two memory components in a RAID level 6 (referred to herein as "RAID 6") configuration because the parity data is written to two memory components. That is, if more than one memory component includes an error in a RAID 5 configuration, conventional memory sub-systems cannot recover the data stored on the memory components. Likewise, if more than two memory components include an error in a RAID 6 configuration, conventional memory sub-systems cannot recover the data stored on the memory components. Additional redundancy can be added to further improve the reliability of data. However, it may be desirable (e.g., efficient, cost effective, etc.) to increase the data reliability and robustness of the memory sub-system without adding more memory components or die including redundant data.

Another conventional technique used to improve the reliability of data stored in a memory sub-system is error correction codes. An error correction code can refer to a technique for expressing a sequence of data to enable errors introduced to the data to be detected and corrected based on the other remaining data. The sequence of data can be referred to as code words. Types of error correction codes can include block codes (e.g., Hamming codes, Reed Solomon codes, etc.). Typically, an encoder encodes the data to be written with additional data bits to form a code word and stripes the code word across the memory components of a memory sub-system. When the striped data is to be read, a decoder decodes the code word by removing the additional data bits and providing the desired original data. Conventionally, error correction codes are not used in conjunction with redundancy operations (e.g., RAID).

Aspects of the present disclosure address the above and other deficiencies by providing a memory sub-system including hybrid iterative error correcting code decoding operations and redundancy error correction decoding operations for data in a memory sub-system. The memory sub-system using the hybrid iterative error code decoding operations correcting and redundancy error correction decoding operations can tolerate a higher average bit error rate while achieving a similar code word failure rate as previous conventional systems that use a redundancy technique (e.g., RAID) or an error correcting operation alone. Thus, the hybrid technique provides a more robust and reliable memory sub-system because it can correct more bit errors than conventional systems while maintaining a similar code word failure rate as conventional systems.

To achieve these benefits, some embodiments can include combining a first level of decoding that performs an error correction code decoding operation to correct data stored in one or more memory components using an error correction code and a second level of decoding that performs a redundancy error correction decoding operation to correct data stored in the one or more memory components using parity data. An error correction code decoding operation can refer to applying an error correction code to data to attempt to decode the data in a stripe. The error correction code decoding operation does not use any information related to the error bit location. A redundancy error correction decoding operation is a type of an error correction code decoding operation. The redundancy error correction decoding operation may or may not use information related to the error bit locations. The first level error correction code decoding operation can be stronger than the second level redundancy error correction decoding operation. That is, the first level error correction code decoding operation can usually correct more errors than the second level redundancy error correction decoding operation. For example, the first level error correction code decoding operation can correct a first number of bits (e.g., 20) out of a 128 byte code word, and the redundancy error correction decoding operation can correct a second number of bits (e.g., 1 symbol) fewer than the first number of bits.

Data stored on each of the memory components of a memory sub-system can be read. The data may have been encoded as a code word and decoding of the code word can be attempted using the error correction code decoding operation. A code word can refer to expressing the data in a particular sequence to enable the detection and correction of errors. Corresponding data stored on a number of the memory components that cannot be decoded can be identified. A determination can be made whether the number of the memory components satisfies a threshold condition. The threshold condition can indicate a number of the corresponding data on the number of memory components that cannot be reconstructed by a redundancy reconstruction operation. A redundancy reconstruction operation may refer to performing a logical operation on the data to reconstruct the data. The redundancy reconstruction operation uses information of the exact error locations and the number of known error locations does not exceed a threshold. In a RAID 6 configuration, the threshold number is two for the corresponding data on the number of the memory components that cannot be reconstructed by a redundancy reconstruction operation. Thus, in the example, if three or more of the corresponding data on the number of memory components cannot be reconstructed by a redundancy reconstruction operation, then the threshold condition is satisfied.

If it is determined that the number of the memory components satisfies the threshold condition, a redundancy error correction decoding operation can be performed to correct the data stored on each of the memory components. Upon performing the redundancy error correction decoding operation, decoding of the code word can be attempted again using the error correction code decoding operation. If the decoding fails, corresponding data stored on a number of the memory components can be identified. The determination can be made again as to whether the threshold condition is still satisfied. If the threshold condition is still satisfied, the redundancy error correction decoding operation can be performed again. Thus, there is an iterative aspect to the disclosed technique.

If at any time it is determined that the corresponding data for the threshold number of the memory components does not satisfy the threshold condition, a redundancy reconstruction operation can be performed to reconstruct the corresponding data stored at the number of the memory components. The redundancy operations can also be referred to as erasure coding, which means that the location of the decoding failure on the memory components is known. The redundancy reconstruction operation can include identifying data stored at a second number of the memory components that can be decoded and applying a logical operation (e.g., exclusive-or (XOR)) based on the data stored at the second number of the memory components to reconstruct the corresponding data on the memory components that could not be decoded.

Advantages of the present disclosure include, but are not limited to, providing improved data reliability for a memory sub-system by using hybrid iterative error correcting and redundancy decoding operations. The data reliability may be improved by iteratively using the error correction code decoding and the redundancy error correction decoding operation when the threshold condition is met (e.g., cannot use the redundancy operation) to correct one or more errors in the memory components. Further, data reliability can also be improved by using the redundancy reconstruction operation when the threshold condition is not satisfied to reconstruct data in the memory components. These benefits can be achieved without adding additional redundant memory components to the memory sub-system, thereby reducing the size and/or cost of data centers. Also, improving the data reliability of a memory sub-system can improve memory sub-system performance as a whole as access operations can succeed.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/ storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 can include a managing component 113 (e.g., circuitry, dedicated logic, programmable logic, firmware, etc.) to perform the operations described herein. In some embodiments, the controller 115 includes at least a portion of the managing component 113. For example, the controller 115 can include a processor 117 (processing device) configured to execute instructions stored in local memory 119 for performing the operations described herein. In some embodiments, the managing component 113 is part of the host system 110, an application, or an operating system.

The managing component 113 can perform hybrid iterative error correction code decoding operations and redundancy error correction decoding operations to data stored in the memory sub-system 110. A threshold condition can be used to determine whether to perform the redundancy error correction decoding operation or the redundancy reconstruction operation to reconstruct data in the memory sub-system 110. The error correction code decoding operation can include any suitable type of error correcting code to correct one or more bit errors (e.g., flipped bits) stored in the memory components 112A-112N. The redundancy error correction decoding operation can include applying parity data to correct one or more bit errors when the threshold condition is satisfied. When the threshold condition is not satisfied, the redundancy reconstruction operation can include performing a logical operation on data stored on memory components where decoding was successful to reconstruct the data stored on the memory components where decoding was not successful.

Figure 2:
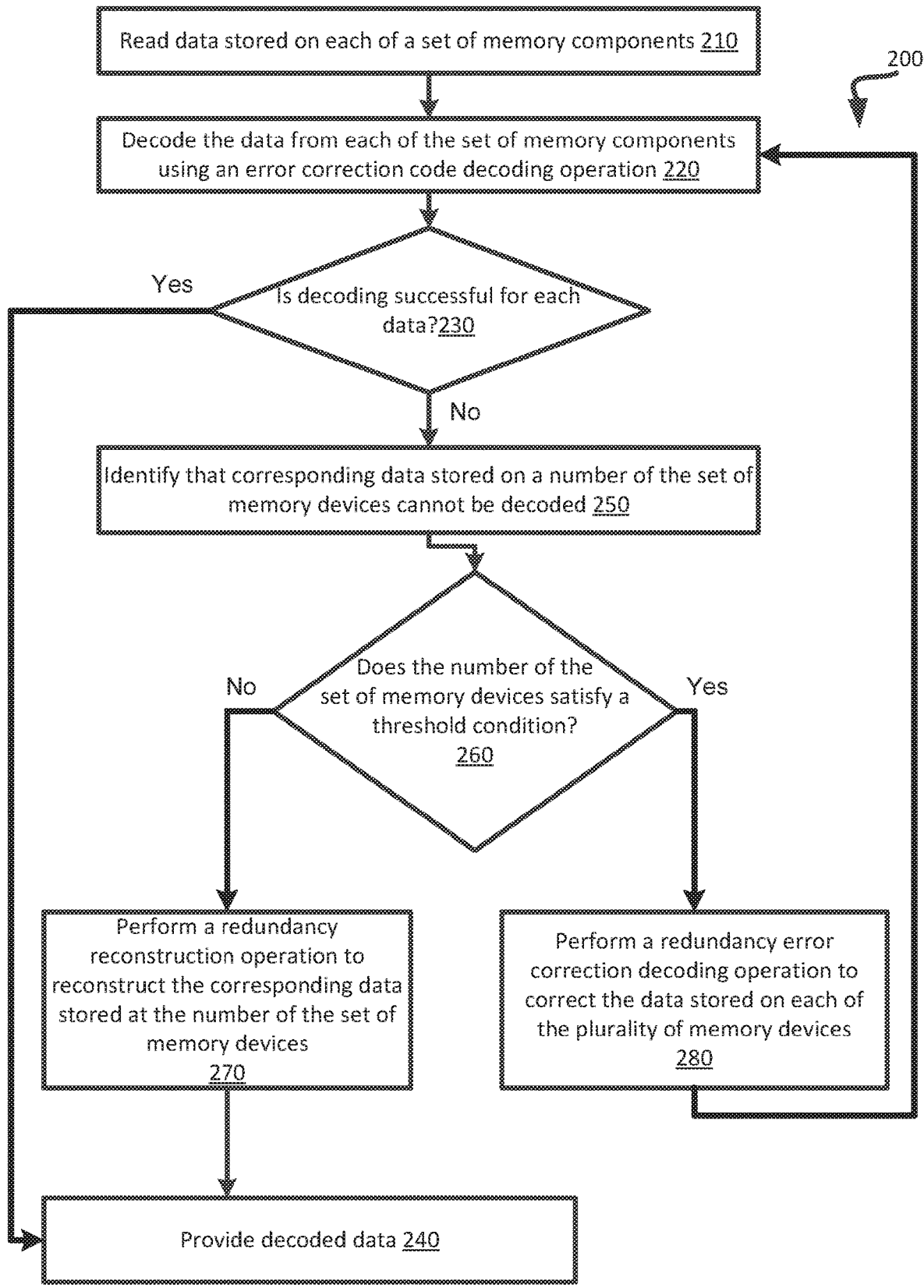
FIG. 2 is a flow diagram of an example method to perform a hybrid iterative error correction code decoding operations and redundancy error correction decoding operations on data based on a threshold condition in accordance with some embodiments.

FIG. 2 is a flow diagram of an example method 200 to perform a hybrid iterative error correction code decoding operations and redundancy error correction decoding operations on data based on a threshold condition in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the managing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 210, the processing logic reads data stored on each of a set of memory components 112A-112N. In some embodiments, data blocks of the data stored on each of the set of memory components 112A-112N can collectively be referred to as a stripe of data. In some embodiments, the data can be a code word that was encoded prior to storing the code word on the set of memory components 112A-112N. Different data blocks of the code word can be written across respective data blocks of the set of memory components 112A-112N. The code word can be encoded based on the type of error correction code to be used when the threshold condition is satisfied.

In some embodiments, a maximum distance separable code, such as a Reed Solomon code, can be used. A Reed Solomon code encodes a block of data by adding extra redundant bits to the data. For example, k data symbols of s bits each can be encoded into an n symbol code word with parity symbols added to the k data symbols. A mathematical operation (e.g., polynomial) can be generated based on the block of data and the parity bits can be obtained using the mathematical operation. The parity bits can be added to the block of data and different data blocks of the block of data including the parity bits can be stored amongst the different memory components 112A-112N.

Various reasons (e.g., noisy communication, memory component failure, asynchronous power loss, etc.) can cause the data of the code word to include errors (e.g., flipped bits, lost bits, etc.). If there are errors in the code word stored across the memory components 112A-112N, the parity bits or other bits of the code word can be used in the original mathematical operation to obtain the original block of data and/or the parity bits and correct the errors in the code word.

At block 220, the processing device decodes the data from each of the set of memory components 112A-112N using an error correction code decoding operation. The error correction code decoding operation can include applying an error correction code to the code word to attempt to decode the code word (e.g., removing the parity bits) and/or fix one or more bit errors. For example, applying the error correction code to the data stored on each of the set of memory components 112A-112N can result in obtaining an updated data including at least one corrected bit. If a Reed Solomon code is used, a mathematical operation (e.g., polynomial) that was used to encode the code word can be used with one or more original bits and/or parity bits of the code word to obtain a correct bit to which to change the bit including the error.

At block 230, the processing device determines whether decoding is successful for each data. Decoding failure can occur when one or more of the corresponding data includes an error on the set of memory components 112A-112N. If decoding is successful for each data, the processing device provides the decoded data at block 240. The decoded data can be provided to a requester (e.g., the host system 120) that requested to access the data.

If decoding is not successful for each data, then at block 250, the processing device identifies that corresponding data stored on a number of the set of memory components 112A-112N cannot be decoded. At block 260, the processing device determines whether the number of the set of memory components 112A-112N satisfies the threshold condition. As previously discussed, the threshold condition can indicate a number of the corresponding data on the number of the set of memory components 112A-112N that cannot be reconstructed by a redundancy reconstruction operation (e.g., logical XOR operation). The number can change based on the type of RAID configuration used. For example, the number is two for RAID 6, and thus, the threshold condition is satisfied when three or more corresponding data on the three or more memory components 112A-112N cannot be reconstructed by a redundancy reconstruction operation. Thus, the number of the corresponding data on the number of the set of memory components 112A-112N that cannot be reconstructed by a redundancy reconstruction operation can be any suitable number.

At block 270, responsive to a determination that the corresponding data for the threshold number of the set of memory components 112A-112N does not satisfy the threshold condition, the processing device performs the redundancy reconstruction operation to reconstruct the corresponding data stored at the number of the set of memory components 112A-112N including the one or more errors. To perform the redundancy reconstruction operation, the processing device can identify data stored at a second number of the set of memory components 112A-112N that can be decoded. Further, the processing device can apply a logical operation (e.g., XOR) based on the data stored at the second number of the set of memory components 112A-112N to reconstruct the corresponding data stored at the number of the set of memory components 112A-112N where data could not be decoded. Upon reconstructing the corresponding data, the data can be provided by the processing device to the requester at block 240.

At block 280, responsive to a determination that the number of the set of memory components 112A-112N does satisfy the threshold condition, the processing device can perform a redundancy error correction decoding operation to correct the data stored on each of the set of memory components 112A-112N. In some embodiments, the redundancy error correction decoding operation performed at block 220 by the processing device can be a second level of decoding and can include performing RAID error correction decoding by applying parity data to the user data stored on each of the set of memory components 112A-112N to obtain an updated data including at least one corrected bit.

In some embodiments, the processing device can return to block 220 to decode the code word again using the error correction code decoding operation and determine whether the threshold condition is still satisfied. For example, after performing the redundancy error correction decoding operation, the processing device can attempt to decode the code word again. At block 230, the processing device can determine again whether decoding is successful for each data. If so, the processing device can provide the decoded data to the requester at block 240. If not, the processing device can identify (block 250) corresponding data stored on a number of the set of memory components 112A-112N that cannot be decoded again and determine (block 260) whether the number of the set of memory components 112A-112N still satisfies the threshold condition. In response to determining that the set of memory components 112A-112N still satisfies the threshold condition after the error correction code decoding operation has been performed, the processing device can perform (block 280) the redundancy error correction decoding operation again to correct another portion of the data stored at the set of memory components 112A-112N. The processing device can again return to block 220 to repeat the process until the threshold condition is no longer satisfied. In this way, the iterative level one decoding (error correction code decoding operation) and level two decoding (redundancy error correction decoding operation) can improve error correction performance by correcting more errors than doing level one decoding by itself or level two decoding by itself.

In response to determining (block 260) that the set of memory components 112A-112N does not satisfy the threshold condition, the processing device can perform (block 240) the redundancy reconstruction operation to reconstruct respective data stored at the set of memory components 112A-112N. The respective data can include other portions of the data with one or more errors that are not corrected by the error correction operation.

Figure 3:
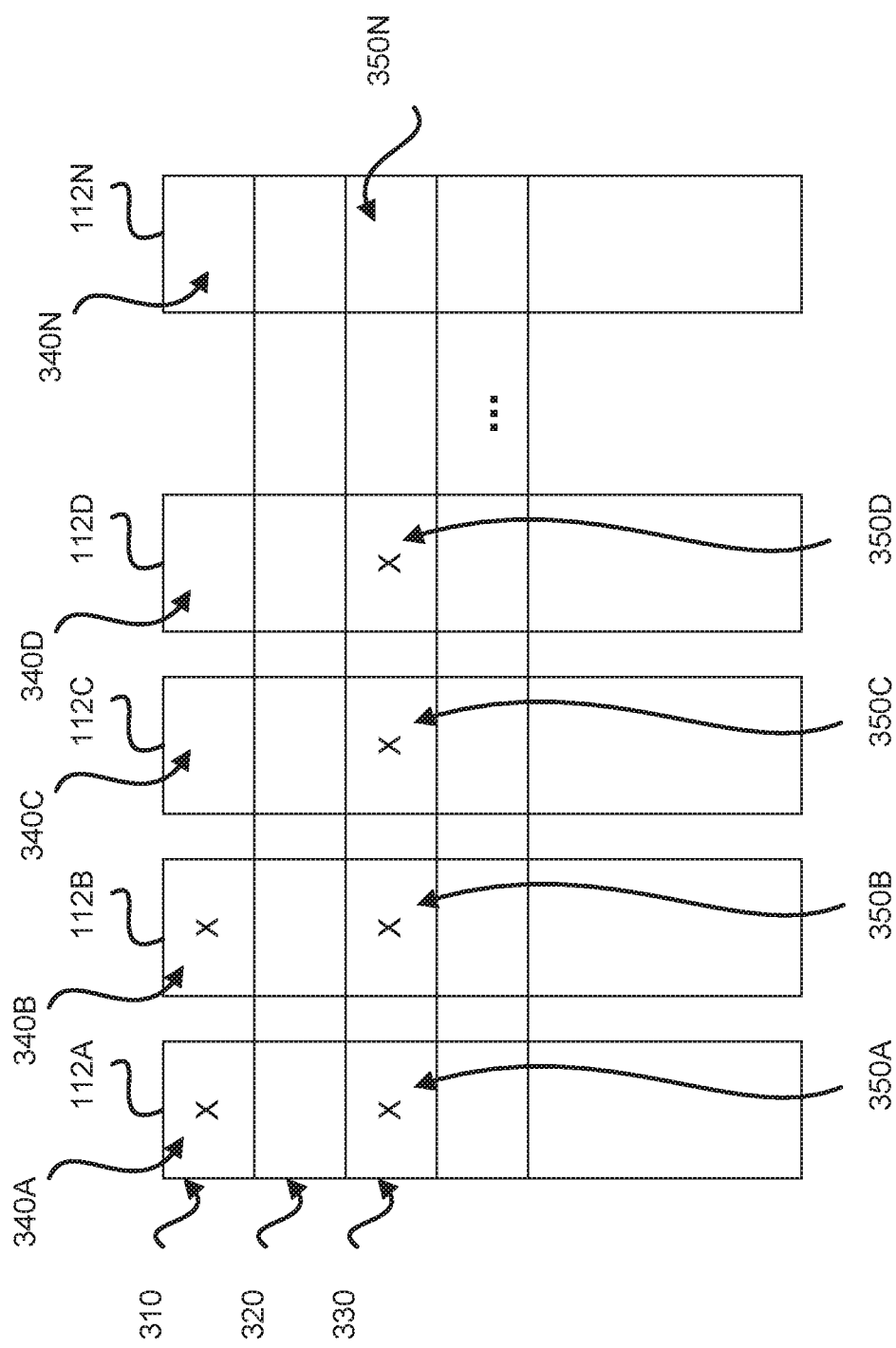
FIG. 3 illustrates example stripes of data including errors stored in data blocks on memory components where the method of FIG. 2 is used to perform the iterative error correction code decoding operation and the redundancy error correction decoding operation based on a threshold condition in accordance with some embodiments of the present disclosure.

FIG. 3 illustrates example stripes of data 310, 320, and 330 including errors stored in data blocks on memory components 112A-112N where the method 200 of FIG. 2 is used to perform the iterative error correction code decoding operation and the redundancy error correction decoding operation based on a threshold condition in accordance with some embodiments of the present disclosure. In some embodiments, the stripes of data 310, 320, and 330 can represent a code word that was encoded prior to being written to the memory components 112A-112N. Accordingly, the stripe of data 310, 320, and 330 can include an original block of data that is to be stored and additional parity data that is determined using the error correction code and added to the original block of data. Each stripe of data 310, 320, and 330 can include one kilobyte of data or any suitable amount of data. The stripes of data 310, 320, and 330 can be read in any order as determined by the host system 120 or upon request by a user of the host system 120. In the following discussion of FIG. 3, it should be understood that RAID 6 is being used, and thus, the threshold condition is three or more of the data stored on the set of memory components 112A-112N that cannot be reconstructed by a redundancy reconstruction operation.

If the stripe of data 310 is determined to be read, each block of data 340A-340N of the stripe 310 stored on the memory components 112A-112N can be read. Decoding of the stripe of data 310 can be attempted, but as illustrated, data blocks 340A and 340B of the stripe 310 include data with one or more errors (represented by X's) and decoding of each data cannot complete successfully. The decoding can include performing an error correction code decoding operation (e.g., level one decoding) described above. An identification can be made that corresponding data on a number (e.g., two) of the set of memory components 112A and 112B cannot be decoded. Further, a determination can be made whether the number of the memory components 112A and 112B satisfies the threshold condition. For this stripe of data 310, the threshold condition is not satisfied because just two (e.g., less than three) of the corresponding data on two of the memory components 112A and 112B include data that cannot be reconstructed by a redundancy reconstruction operation due to errors. Accordingly, since the threshold condition is not satisfied, the redundancy reconstruction operation can be performed on the data that can be decoded in data blocks 340C and 340D-340N to reconstruct the data in data blocks 340A and 340B of the stripe of data 310. Once data reconstruction completes and the errors are removed, the stripe of data 310 can be decoded.

If the stripe of data 330 is determined to be read, each block of data 350A-350N of the stripe 310 stored on the memory components 112A-112N can be read. Decoding of the stripe of data 330 can be attempted, but as illustrated, data blocks 350A, 350B, 350C, and 350D of the stripe 310 include data with one or more errors and decoding of each data cannot complete successfully. In some embodiments, decoding can include performing an error correction code decoding operation (e.g., level one decoding) described above. An identification can be made that corresponding data on a number (e.g., four) of the set of memory components 112A, 112B, 112C, and 112D cannot be decoded. Further, a determination can be made whether the number of the memory components 112A, 112B, 112C, and 112D satisfies the threshold condition. For this stripe of data 330, the threshold condition is satisfied because four (e.g., more than three) of the corresponding data on four of the memory components 112A, 112B, 112C, and 112D include data that cannot be decoded due to errors. Accordingly, since the threshold condition is satisfied, the redundancy error correction decoding operation can be performed to correct the data stored on each of the memory components 112A, 112B, 112C, and 112D. In some embodiments, the redundancy error correction decoding operation can be referred to as the second level decoding, as described above.

Subsequent to performing the redundancy error correction decoding operation, the iterative process can perform the error correction code decoding operation again, and a determination can be made whether the threshold condition is still satisfied. Depending on whether the threshold condition is satisfied, the redundancy error correction decoding operation (level two decoding) or the redundancy reconstruction operation can be performed to remove the remaining errors. For example, if the threshold condition is still satisfied, the redundancy error correction decoding operation can be performed again on the stripe of data 330 to correct one or more errors in the data. If the threshold condition is no longer satisfied, then the redundancy reconstruction operation can be performed to reconstruct the data in the data blocks that could not be decoded. Once the errors are removed from the stripe of data 330, the stripe of data can be decoded and provided to a requester.

Figure 4:
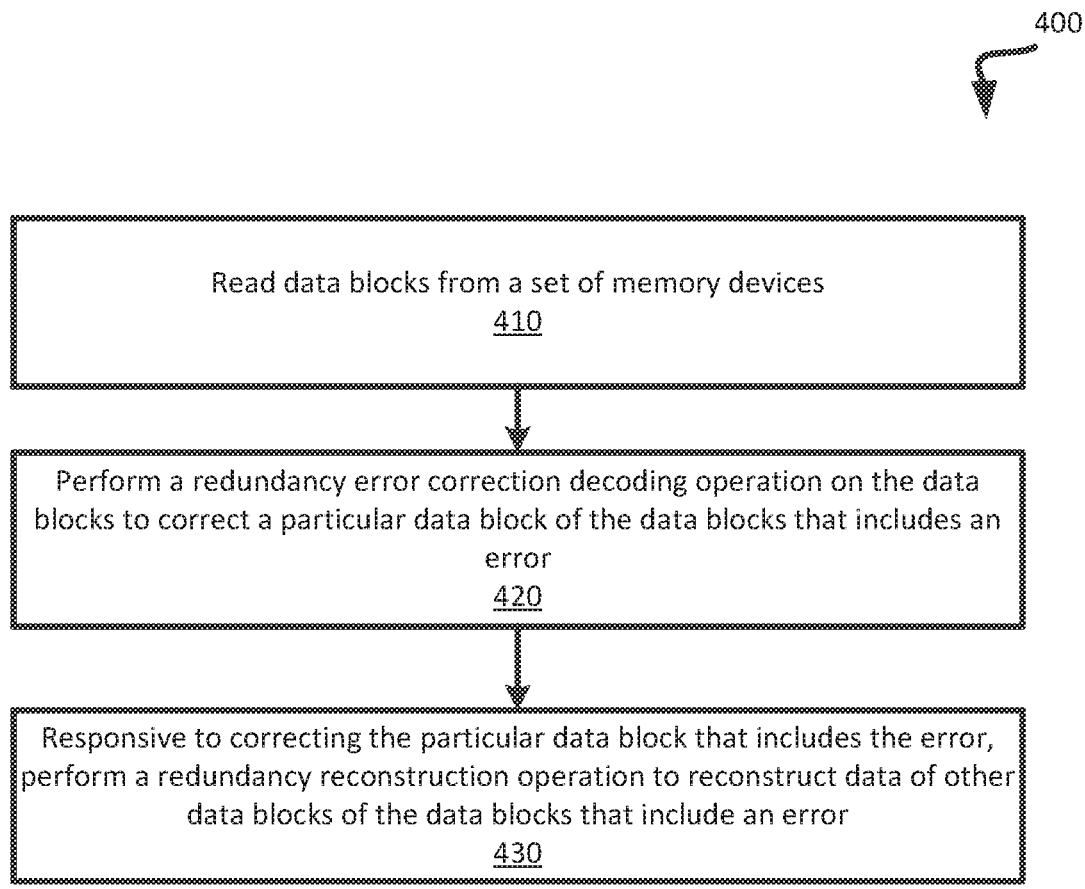
FIG. 4 is a flow diagram of an example method to perform a redundancy error correction decoding operation and a redundancy reconstruction operation on data in data blocks of memory components in accordance with some embodiments.

FIG. 4 is a flow diagram of an example method 400 to perform a redundancy error correction decoding operation and a redundancy reconstruction operation on data in data blocks of memory components 112A-112N in accordance with some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the managing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 410, the processing device reads data blocks from a set of memory components 112A-112N. The data blocks can include a stripe of data that represents a code word encoded using an error correction code. In some embodiments, the processing device can decode the code word using the error correction code (e.g., level one ECC decoding). In some instances, the data blocks can include one or more bit errors that prevent corresponding data of some of the data blocks from being decoded successfully. As previously described, the level one error correction code decoding operation can include applying an error correction code to the data stored on each of the set of memory components 112A-112N to obtain an updated data including at least one corrected bit. Applying the error correction code can include applying a mathematical operation to a portion or all of the data of the data blocks to derive the corrected bit. The corrected bit can be used to change the bit with the error. The processing device can determine that a number of the set of memory components 112A-112N that include data blocks with one or more errors satisfies the threshold condition.

At block 420, the processing device performs a redundancy error correction decoding operation on the data blocks to correct a particular data block of the data blocks that includes an error. As previously described, the redundancy error correction decoding operation (level two decoding) can include using parity data with the data stored on each of the set of memory components 112A-112N to obtain an updated data including at least one corrected bit.

In some embodiments, after performing the error correction operation, the processing device can iteratively attempt to decode the data in the data blocks using the error correction code decoding operation (level one decoding) again. If the decoding does not complete successfully for each data, the processing device can determine whether the threshold condition is still satisfied. The process of performing level one error decoding and level two decoding while the threshold condition is still satisfied can be iteratively performed until the threshold condition is no longer satisfied. If it is determined that a number of the set of memory components including data blocks that include errors (e.g., cannot be decoded) does not satisfy the threshold condition, then the redundancy reconstruction operation can be performed.

Accordingly, at block 430, responsive to correcting the particular data block that includes the error, the processing device can perform the redundancy reconstruction operation to reconstruct data of other data blocks that include an error. To perform the redundancy reconstruction operation, the processing device can identify a subset of data blocks of the set of memory components 112A-112N that do not include errors. Further, the processing device can apply a logical operation (e.g., XOR) based on the subset of data blocks to reconstruct the data of the other data blocks that include an error.

Figure 5:
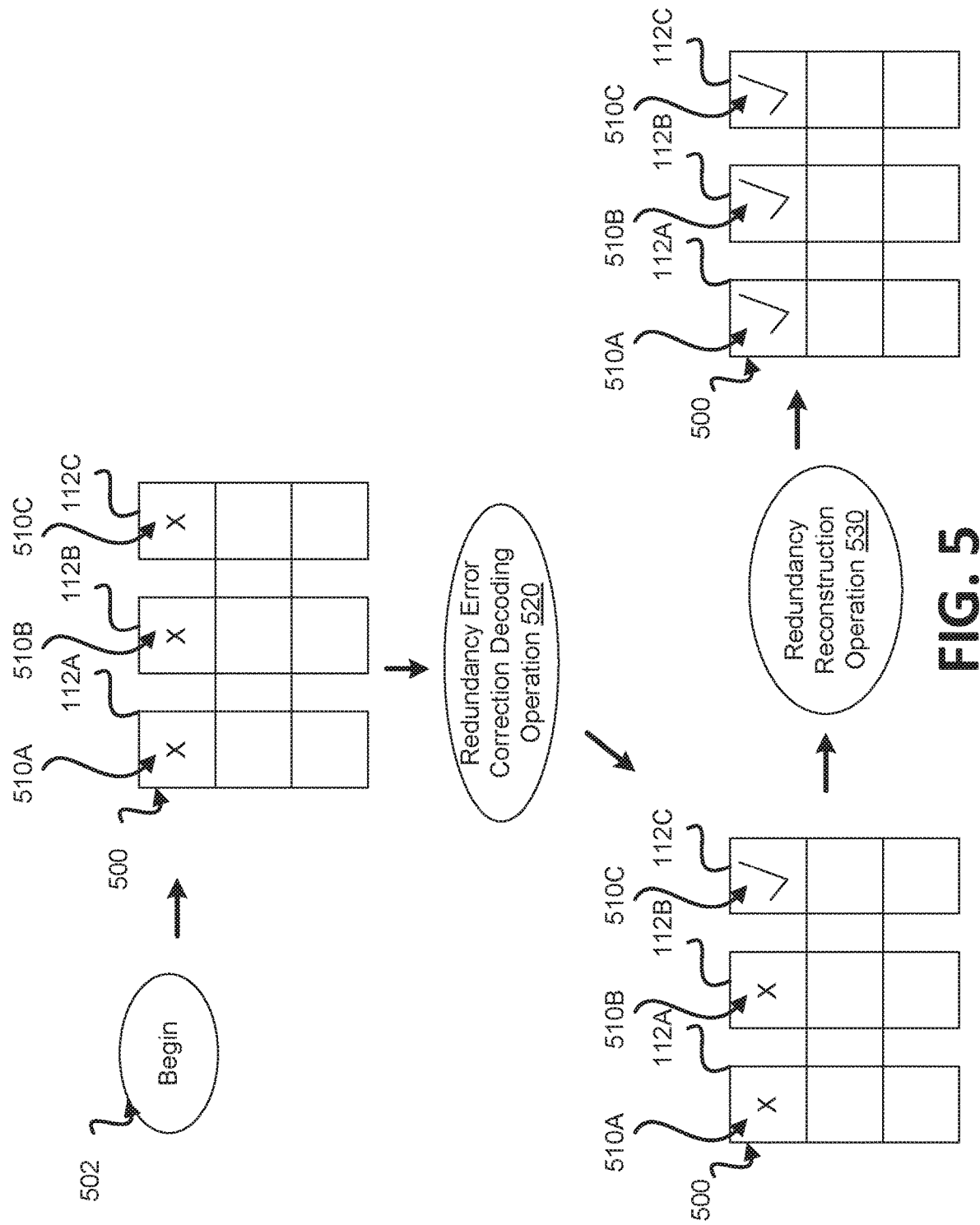
FIG. 5 illustrates an example stripe of data stored in data blocks on memory components where the method of FIG. 4 is used to perform the redundancy error correction decoding operation and redundancy reconstruction operation to remove errors from data in accordance with some embodiments of the present disclosure.

FIG. 5 illustrates an example stripe of data 500 stored in data blocks 510A, 510B, and 510C on memory components 112A, 112B, and 112C where the method 400 of FIG. 4 is used to perform the redundancy error correction decoding operation 520 and redundancy reconstruction operation 530 to remove errors from data in accordance with some embodiments of the present disclosure. Although just three memory components 112A, 112B, and 112C are depicted, it should be understood that any suitable number of memory components can be used. In the following description of FIG. 5, it should be understood that RAID 6 is being used, and thus, the threshold condition is three or more of the data stored on the set of memory components 112A-112N that cannot be reconstructed by a redundancy reconstruction operation.

The method 400 can begin at circle 502, where the stripe of data 500 is determined to be read. Accordingly, each block of data 510A, 510B, and 510C of the stripe 500 stored on the memory components 112A, 112B, and 112C can be read. Decoding (e.g., using the error correction code decoding operation) of the stripe 500 can be attempted and one or more bit errors can be fixed. However, the decoding of each data in the stripe 500 may fail, because as illustrated, data blocks 510A, 510B, and 510C of the stripe 500 include data with one or more errors (represented by X's). A determination can be made that a number (e.g., three) of the memory components 112A, 112B, and 112C including data blocks 510A, 510B, and 510C with errors satisfies the threshold condition (e.g., three or more memory components with data that cannot be reconstructed by the redundancy reconstruction operation). Accordingly, since the threshold condition is satisfied, the error correction operation 520 can be performed to correct a particular data block of the data blocks 510A, 510B, and 510C on each of the memory components 112A, 112B, 112C, and 112D.

The redundancy error correction decoding operation 520 (level two decoding) can include applying parity data to the data blocks 510A, 510B, and 510C to obtain updated data with at least one corrected bit. As depicted, after performing the redundancy error correction decoding operation 520, the data in the data block 510C is corrected and the error is removed (represented by a check mark) by the redundancy error correction decoding operation 520. Also as depicted, the data blocks 510A and 510B still include errors and the read of the stripe 500 cannot complete. A determination can be made that the number (e.g., two) of the memory components 112A, 112B, and 112C that include data blocks with errors (e.g., data blocks 510A and 510B) does not satisfy the threshold condition anymore (e.g., less than three).

In some embodiments, when the threshold condition is not satisfied, the redundancy reconstruction operation 530 can be performed. The redundancy reconstruction operation 530 can apply a logical operation (e.g., XOR) to data in data blocks without errors (e.g., data block 510C) to reconstruct the data in data blocks 510A and 510B including errors. After reconstruction of the data in the data blocks 510A and 510B, the errors are removed from their respective data (represented by the check marks). The error-free stripe of data 500 can be read and/or provided to a requester (e.g., host system 120).

Figure 6:
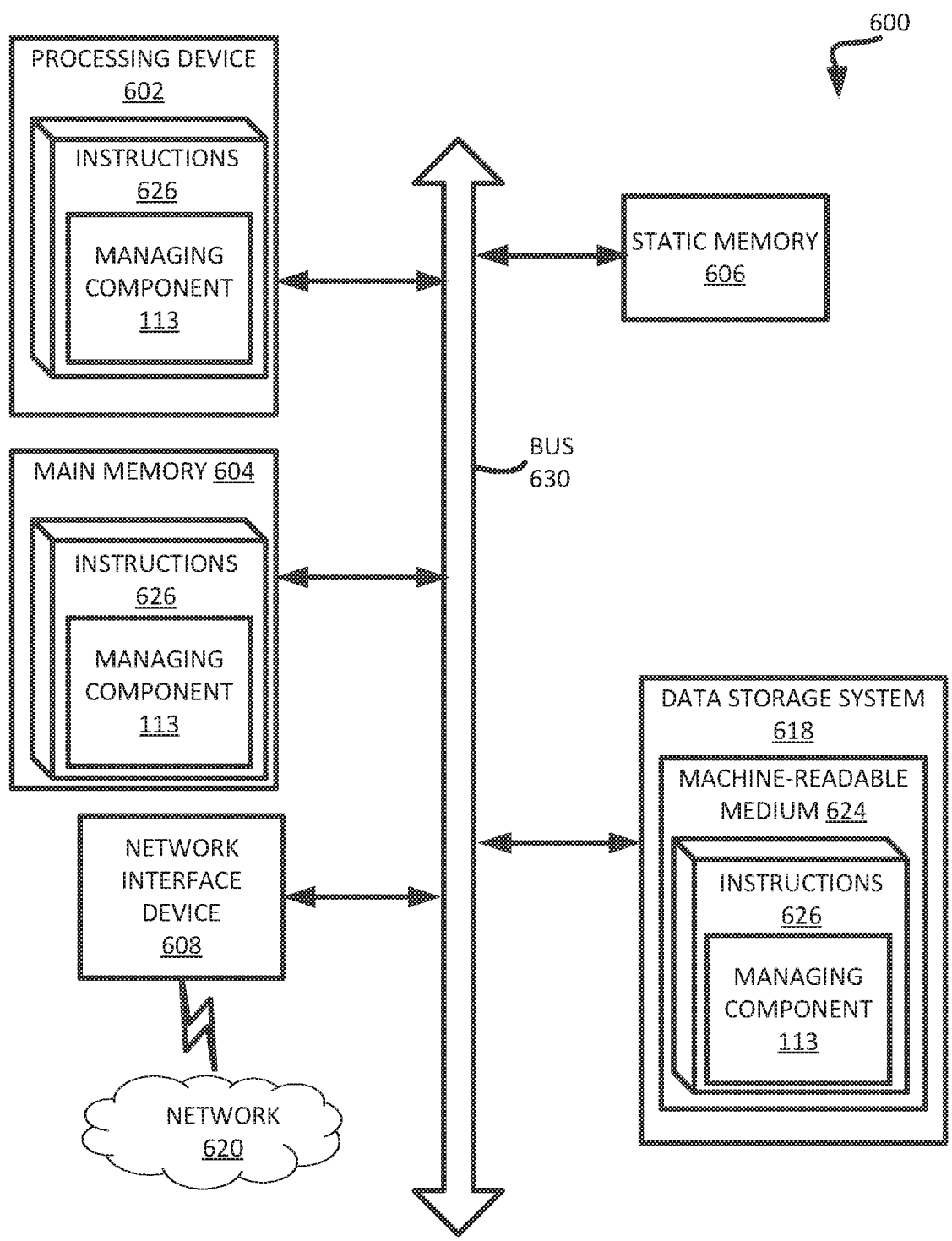
FIG. 6 is a block diagram of an example computer system in which implementations of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the managing component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a managing component (e.g., the managing component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   reading a stripe of data stored across a plurality of memory components, wherein each unit of data in the stripe of data is stored on a different one of the plurality of memory components;
   determining that decoding of one or more units of data stored on a subset of the plurality of memory components was unsuccessful using an error correction code (ECC) decoding operation;
   determining whether a number of memory components of the subset of the plurality of memory components that include the one or more units of data for which the decoding was unsuccessful using the ECC decoding operation satisfies a threshold condition; and
   responsive to determining that the number of memory components of the subset of the plurality of memory components that include the one or more units of data for which the decoding was unsuccessful using the ECC decoding operation satisfies the threshold condition, performing, by a processing device, a redundancy error correction decoding operation to correct the stripe of data stored across the plurality of memory components.

2. The method of claim 1, further comprising:
   responsive to determining that the number of memory components of the subset of the plurality of memory components that include the one or more units of data for which the decoding was unsuccessful using the ECC decoding operation does not satisfy the threshold condition, performing a redundancy reconstruction operation to reconstruct the one or more units of data stored at the number of memory components of the subset of the plurality of memory components.

3. The method of claim 2, further comprising:
   identifying data stored at a second subset of the plurality of memory components for which the decoding was successful, wherein the redundancy reconstruction operation corresponds to applying a logical operation based on the data stored at the second subset of the plurality of memory components to reconstruct the one or more units of data stored at the number of memory components of the subset of the plurality of memory components.

4. The method of claim 1, wherein performing the redundancy error correction decoding operation comprises:
   applying parity data to the stripe of data stored across the plurality of memory components to obtain an updated data including at least one corrected bit.

5. The method of claim 1, further comprising:
   subsequent to the redundancy error correction decoding operation being performed, performing a second ECC decoding operation on the stripe of data;
   determining that a portion of the subset of the plurality of memory components that include the one or more units of data for which the decoding was unsuccessful using the second ECC decoding operation satisfies the threshold condition after the second ECC decoding operation has been performed;
   in response to determining that a number of the portion of the subset of the plurality of memory components that include the one or more units of data for which the decoding was unsuccessful using the second ECC decoding operation satisfies the threshold condition after the second ECC decoding operation has been performed, performing a second redundancy error correction decoding operation to correct another portion of the stripe of data stored at the plurality of memory components.

6. The method of claim 5, further comprising:
   subsequent to the second redundancy error correction decoding operation being performed, performing a third ECC decoding operation on the data;
   determining that a second portion of the subset of the plurality of memory components that include the one or more units of data for which the decoding was unsuccessful using the third ECC decoding operation does not satisfy the threshold condition after the third ECC decoding operation has been performed; and
   performing a redundancy reconstruction operation to reconstruct respective data stored at the subset of the plurality of memory components, the respective data being other portions of the data with one or more errors that are not corrected by the third ECC decoding operation.

7. A system comprising:
   a plurality of memory components; and
   a processing device, operatively coupled with the plurality of memory components, to perform operations comprising:
   reading a stripe of data stored across a plurality of memory components;
   determining that decoding of one or more units of data stored on a subset of the plurality of memory components was unsuccessful using an error correction code (ECC) decoding operation;
   determining whether a number of memory components of the subset of the plurality of memory components that include the one or more units of data for which the decoding was unsuccessful using the ECC decoding operation satisfies a threshold condition; and
   responsive to determining that the number of memory components of the subset of the plurality of memory components that include the one or more units of data for which the decoding was unsuccessful using the ECC decoding operation satisfies the threshold condition, performing a redundancy error correction decoding operation to correct the stripe of data stored across the plurality of memory components.

8. The system of claim 7, wherein the processing device to perform further operations comprising:
responsive to determining that the number of memory components of the subset of the plurality of memory components that include the one or more units of data for which the decoding was unsuccessful using the ECC decoding operation does not satisfy the threshold condition, performing a redundancy reconstruction operation to reconstruct the one or more units of data stored at the number of memory components of the subset of the plurality of memory components.

9. The system of claim 8, wherein the processing device to perform further operations comprising:
identifying data stored at a second subset of the plurality of memory components for which the decoding was successful, wherein the redundancy reconstruction operation corresponds to applying a logical operation based on the data stored at the second subset of the plurality of memory components to reconstruct the one or more units of data stored at the number of memory components of the subset of the plurality of memory components.

10. The system of claim 7, wherein performing the redundancy error correction decoding operation comprises:
applying parity data to the stripe of data stored across the plurality of memory components to obtain an updated data including at least one corrected bit.

11. The system of claim 7, wherein the processing device to perform further operations comprising:
subsequent to the redundancy error correction decoding operation being performed, performing a second ECC decoding operation on the stripe of data;
determining that a portion of the subset of the plurality of memory components that include the corresponding one or more units of data for which the decoding was unsuccessful using the second ECC decoding operation satisfies the threshold condition after the second ECC decoding operation has been performed;
in response to determining that a number of the plurality of memory components that include the one or more units of data for which the decoding was unsuccessful using the second ECC decoding operation satisfies the threshold condition after the second ECC decoding operation has been performed, performing a second redundancy error correction decoding operation to correct another portion of the stripe of data stored at the plurality of memory components.

12. The system of claim 11, wherein the processing device to perform further operations comprising:
subsequent to performing the second redundancy error correction operation, performing a third ECC decoding operation on the data;
determining that a second portion of the subset of the plurality of memory components that include the one or more units of data for which the decoding was unsuccessful using the third ECC decoding operation does not satisfy the threshold condition after the third ECC decoding operation has been performed; and
performing a redundancy reconstruction operation to reconstruct respective data stored at the subset of the plurality of memory components, the respective data being other portions of the data with one or more errors that are not corrected by the third ECC decoding operation.

13. A non-transitory computer-readable storage medium comprising instructions that, when executed by a processing device, cause the processing device to:
read a plurality of data blocks from a plurality of memory components;
determine that a number of memory components of the plurality of memory components having data blocks that include an error satisfies a threshold condition;
perform a redundancy error correction decoding operation on the plurality of data blocks to correct a particular data block of the plurality of data blocks that includes an error; and
responsive to correcting the particular data block that includes the error, perform a redundancy reconstruction operation to reconstruct data of other data blocks of the plurality of data blocks that include an error.

14. The computer-readable media of claim 13, wherein the threshold condition indicates a number of corresponding data of data blocks on the plurality of memory components for which reconstruction was unsuccessful using the redundancy reconstruction operation.

15. The computer-readable media of claim 13, wherein, prior to performing the redundancy reconstruction operation, the processing device further to:
determine that the number of memory components of the plurality of memory components having data blocks that include errors does not satisfy the threshold condition.

16. The computer-readable media of claim 13, wherein to perform the redundancy error correction decoding operation, the processing device further to:
apply parity bits to the data stored on each of the plurality of memory components to obtain an updated data including at least one corrected bit.

17. The computer-readable media of claim 13, wherein to perform the redundancy reconstruction operation, the processing device further to:
identify a subset of data blocks of the plurality of memory components that do not include errors; and
apply a logical operation based on the subset of data blocks to reconstruct the data of the other data blocks of the plurality of data blocks that include an error.

* * * * *

UNITED STATES PATENT AND TRADEMARK OFFICE
CERTIFICATE OF CORRECTION

PATENT NO. : 10,747,614 B2
APPLICATION NO. : 16/042812
DATED : August 18, 2020
INVENTOR(S) : Ying Yu Tai, Jiangli Zhu and Zhengang Chen Page 1 of 1

It is certified that error appears in the above-identified patent and that said Letters Patent is hereby corrected as shown below:

In the Claims

In Claim 11, Column 17, Line 37, after "that include the" delete "corresponding"

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*